(12) United States Patent
Lee et al.

(10) Patent No.: US 9,001,583 B2
(45) Date of Patent: Apr. 7, 2015

(54) ON-CHIP HV AND LV CAPACITORS ACTING AS THE SECOND BACK-UP SUPPLIES FOR NVSRAM AUTO-STORE OPERATION

(71) Applicant: Aplus Flash Technology, Inc, San Jose, CA (US)

(72) Inventors: Peter Wung Lee, Saratoga, CA (US); Hsing-Ya Tsao, San Jose, CA (US)

(73) Assignee: Aplus Flash Technology, Inc., Fremont, CA (US)

(*) Notice: Subject to any disclaimer, the term of this patent is extended or adjusted under 35 U.S.C. 154(b) by 37 days.

(21) Appl. No.: 14/053,549

(22) Filed: Oct. 14, 2013

(65) Prior Publication Data

US 2014/0104946 A1   Apr. 17, 2014

Related U.S. Application Data

(60) Provisional application No. 61/714,186, filed on Oct. 15, 2012.

(51) Int. Cl.

| | |
|---|---|
| G11C 11/34 | (2006.01) |
| G11C 16/30 | (2006.01) |
| G11C 5/14 | (2006.01) |
| G11C 14/00 | (2006.01) |
| G11C 16/12 | (2006.01) |
| G11C 16/22 | (2006.01) |

(52) U.S. Cl.
CPC ............ *G11C 16/30* (2013.01); *G11C 5/141* (2013.01); *G11C 14/0063* (2013.01); *G11C 16/12* (2013.01); *G11C 16/22* (2013.01)

(58) Field of Classification Search
USPC ...................... 365/185.08, 154, 229
See application file for complete search history.

(56) References Cited

U.S. PATENT DOCUMENTS

| | | | |
|---|---|---|---|
| 4,263,664 A | * | 4/1981 | Owen et al. ............. 365/185.08 |
| 4,703,456 A | | 10/1987 | Arakawa |
| 4,980,859 A | * | 12/1990 | Guterman et al. ....... 365/185.08 |
| 5,065,362 A | | 11/1991 | Herdt et al. |
| 5,563,839 A | | 10/1996 | Herdt et al. |
| 5,602,776 A | | 2/1997 | Herdt et al. |
| 5,757,696 A | * | 5/1998 | Matsuo et al. .......... 365/185.07 |
| 5,828,599 A | | 10/1998 | Herdt |
| 5,903,561 A | | 5/1999 | Kwon |
| 6,026,018 A | | 2/2000 | Herdt et al. |
| 6,097,629 A | | 8/2000 | Dietrich et al. |
| 6,285,586 B1 | | 9/2001 | Lung et al. |
| 6,414,873 B1 | | 7/2002 | Herdt |
| 7,110,293 B2 | | 9/2006 | Jung |
| 7,164,608 B2 | | 1/2007 | Lee |
| 7,269,054 B2 | | 9/2007 | Kang et al. |

(Continued)

*Primary Examiner* — Huan Hoang
(74) *Attorney, Agent, or Firm* — Raywell Group, LLC

(57) ABSTRACT

Two on-chip capacitors including one HV capacitor VPPcap and one LV VCC capacitor VCCcap are built over a NVSRAM memory chip as a back-up second power supplies for each NVSRAM cell, regardless of 1-poly, 2-poly, PMOS or NMOS flash cell structures therein. The on-chip HV and LV capacitors are preferably made from one or more MIM or MIP layers for achieving required capacitance. A simplified VCC power system circuit without a need of a State machine designed for performing only one NVSRAM Program operation without Erase operations is proposed for initiating NVSRAM's Auto-Store operation without using any off-chip Vbat and Vcap. During the Auto-Store operation, all HV pumps and oscillators associated with the two on-chip capacitors are shut off once VCC voltage drop is detected by a VCC detector to be below 80% of regular VDD level.

35 Claims, 6 Drawing Sheets

(56) References Cited

U.S. PATENT DOCUMENTS

| | | |
|---|---|---|
| 7,280,397 B2 | 10/2007 | Scheuerlein |
| 7,408,801 B2 | 8/2008 | Kang et al. |
| 7,505,303 B2 | 3/2009 | Ashokkumar et al. |
| 7,518,916 B2 | 4/2009 | Ashokkumar et al. |
| 7,539,054 B2 | 5/2009 | Ashokkumar et al. |
| 7,663,917 B2 | 2/2010 | Cuppens et al. |
| 7,710,776 B2 | 5/2010 | Johal et al. |
| 7,760,540 B2 | 7/2010 | Still |
| 7,859,899 B1 | 12/2010 | Shakeri et al. |
| 7,890,804 B2 | 2/2011 | Mann et al. |
| 8,018,768 B2 | 9/2011 | Shih et al. |
| 8,036,032 B2 | 10/2011 | Scade et al. |
| 8,331,134 B2 | 12/2012 | Chiu et al. |

* cited by examiner

ON-CHIP HV AND LV CAPACITORS ACTING AS THE SECOND BACK-UP SUPPLIES FOR NVSRAM AUTO-STORE OPERATION

CROSS-REFERENCE TO RELATED APPLICATIONS

This application claims priority to U.S. Patent Application No. 61/714,186, filed on Oct. 15, 2012, commonly assigned, and hereby incorporated by reference in its entirety herein for all purposes.

This application is related to U.S. Pat. No. 7,164,608, and U.S. patent application Ser. No. 14/037,356, commonly assigned, which are incorporated by reference herein for all purposes.

Additionally, this application is related to U.S. Pat. Nos. 5,065,362 and 7,760,540.

TECHNICAL FIELD OF THE INVENTION

The present embodiments relate to several improvements of conventional NVSRAM's Auto-Store" operation upon VCC power loss by adding two on-chip instant VPP and VCC power supplies, carefully designed VPP and VCC internal power buses, the low-power VPP and VCC switching circuits as well as a well-designed reduced logic control steps without any state-machine to perform single function of Auto-Store operation.

The preferred on-chip VPP and VCC supplies are formed by using two MIM-type capacitors, VPPcap and VCCcap, right on top of chip layout with shielding metal along with one HV-stress-resistant switching circuit such as VPPsft (+HV, VPP-Level-Shifter) and VCCsft (VCC-Level-Shifter) for operating next-generation NVSRAM memory that uses a low-current FN-channel program scheme for "Store" operation without an off-chip bulky and costly battery or a big VCC capacitor that supplies no VPP but only a LV VCC.

BACKGROUND OF INVENTION

A number of non-volatile memory (NVM) technologies, are co-existing in the unlimitedly repeat P/E market today. These NVMs include flash, battery-backed SRAM (BB-SRAM), electrically erased programmable read-only memory (EEPROM) and NVSRAM, which integrates both NVM and SRAM in cell level within one monolithic chip.

Table 1 below provides a summary of the key features of these memory types.

| Parameters | NAND flash | EEPROM | BBSRAM | NVSRAM |
|---|---|---|---|---|
| Nonvolatile | Yes | Yes | Yes | Yes |
| Unlimited endurance | No | No | Yes | Yes |
| Random access | No | No | Yes | Yes |
| Battery needed? | No | No | Yes | No |
| VCCcap needed? | No | No | No | Yes |
| Fast Read & Write 25-45ns | No | No | No | Yes |
| Byte-programmable | No | Yes | Yes | Yes |
| FN-channel P/E? | Yes | Yes | No | Yes |
| SBPI* | Yes | No | No | Yes |

*SBPI: Self-Boost-Program-Inhibit Scheme

The NAND flash memory is frequently used to store a huge Gb code and data in unit of a block size, ranging from 512 Kb to 2 Mb, for audio and video applications. Typically, the NAND flash read speed is 20 µs in a page is a NVM memory.

In contrast, the EEPROM memory is frequently utilized to store small amount of non-volatile configuration bits or data. However, compared with other non-volatile technologies, EEPROM density is lower with a slower Read speed of 100 ns and Write speed of 2 ms, making it unacceptable as a single memory technology for many medical applications.

The NAND flash is much cheaper than EEPROM in terms of bit price. But EEPROM has a superior 1M P/E endurance performance in unit of Byte over NAND's 100K in unit of Block. As a result, both NAND and EEPROM result in limited read/write cycles that can wear out the memory devices in repetitive applications, ultimately causing loss of data.

FIG. 1 shows two conventional 8-pin packages for an I2C Serial EEPROM product. The names of 8 pins are defined in order from pin1 to pin8 of A0, A1, A2, VSS, SDA, SCL, WP and VCC. There are no extra pins for connecting Vbat (battery) and Vcap (VCC capacitor) in addition to the regular VCC in pin1 of PDIP/SOIC/TSSOP/MSOP 8-pin package or VCC in pin2 of TSSOP 8-pin package.

In this conventional 8-pin I2C EEPROM, every Read, Program and Erase operations are performed under a stable and strong VCC supply connected to pin1. In the event that VCC in pin1 is removed, all on-going Read, Program and Erase operations will be interrupted and fail because there is no second source of VCC that can immediately replace VCC in pin1 to complete the operation. Although EEPROM is a non-volatile memory, the new data during the HV erase or HV program course would get corrupted.

Since this I2C package has three address pins of A0, A1 and A2, thus a total of eight I2C EEPROMs can be connected in I2C memory system when the density requirement needs to be expanded from one to eight. The rotated TSSOP package shown on the right also indicates an 8-pin configuration without any Vbat and Vcap pins with a primary LV VCC supply at pin2.

While traditional SRAM is a volatile memory technology so that its data cannot be retained permanently once the VCC power supply is being removed. But the VM SRAM memory has one great advantage over the NVM memories of NAND and EEPROM. The SRAM has unlimited P/E endurance cycles.

FIG. 2 shows a Vcap assigned to pin1 to replace A0 for a regular 8-pin I2C Serial NVSRAM product. The VCC in pin8 is the first regular VCC power supply, while the Vcap in pin1 acts as the second VCC back-up supply. In a normal NVS-RAM operation, the pin1 Vcap is always being fully charged to a VCC voltage level by drawing charges from VCC in pin8 through one VCC switch circuit controlled by the on-chip state machine.

When the VCC power in pin8 is pulled down due to power loss below a predetermined value such as 80% of a full VCC value, then the internal VCC detector would immediately switch and connect the on-chip common VCC power supply lines to the second back-up off-chip Vcap at pin1, which is always kept in a full-charge state before the VCC power loss occurs at pin8. This VCC power switching has to be completed promptly to meet a specification of less than few ms before the internal SRAM VM data is corrupted and lost.

Despite an off-chip Vcap in pin1, it can quickly replace the falling VCC in pin 8 in today's NVSRAM design, one drawback is that NVSRAM still takes a long time and consumes high VCC power from Vcap to commence the on-chip VPP pump, oscillator and the associated logic control circuits to ensure that the operation of the "Store" operation is securely performed without losing any SRAM data upon the VCC power loss at pin8.

Both the logic control and VPP (or VNN) pump circuits draw huge VCC power from the Vcap at pin1 after VCC power loss at pin8. The charges of Vcap flows into internal VCC buses through the pin1 inductance 10 nH of pin1 bonding wire. Currently, the NVSRAM Store operation undergoes two VCC-power-intensive HV steps of erase first and program later. That means both VNN pump and VPP pump are involved along with their associated oscillators. Plus the on-chip state machine that controls these control sequences also draw a substantial VCC current. As a result, the size and value of the Vcap capacitance become very crucial at pin1.

Typically, the average Vcap value is around 100 uF for a NVSRAM memory density below 4 Mb to sustain few hours for normal operation. The unit price of a typical Vcap varies from $0.1 to $1 with a big footprint, depending on the purchased quantity and quality.

There are variants that include an on-chip battery to maintain the operation of SRAM device in the event of an unexpected power loss. Known as BBSRAM, this type of memory requires a large physical size because the battery, power management circuitry and the SRAM are combined into a single package. BBSRAMs are generally optimized to conserve battery power since the small battery has limited power, so low-power SRAMs must be used. Unfortunately, an attribute of low-power SRAMs is its slower access time, making them unsuitable for many medical applications like infusion pumps.

FIG. 3 shows a battery, Vbat, connection being assigned to pin7 for a regular 8-pin SPI Serial NVSRAM product. The VCC in pin8 is still the first regular VCC power supply, while Vbat in pin7 acts as the second VCC back-up supply.

This is called the 8-pin Serial-type BBSRAM, a Battery-Backed SRAM. Internally, there is no any kind of on-chip NVM. The whole BBSRAM is a SRAM silicon die packaged with an off-chip battery with a connection in pin7. This BBSRAM chip can be configured into either I2C or SPI serial type memory. Due to the adding of a battery, each BBSRAM memory would have the advantage of blending the performances of a regular VM SRAM with high-speed read and write plus the non-volatile feature of Flash.

Again, as seen from the above figures, Vbat has many disadvantages such as high cost, bulkiness, and concern over environmental handling. In addition, sooner or later, the power supply of Vbat would become used up. Before that, a constant monitoring of Vbat voltage level is required. As a result, the BBSRAM system is more complicate, thus the market share is smaller than its NVSRAM counterpart.

Another shortcoming of BBSRAM is the additional point of failure introduced by the battery due to its limited life span. Once the battery loses its ability to maintain a charge, the unit represents a significant risk because it is incapable of providing robust and secure backup of patient-critical data.

Because of the shortcomings encountered with these nonvolatile memory types, an increasing number of manufacturers are using NVSRAMs. The NVSRAM is a memory technology that combines a high-speed SRAM with an equal amount of non-volatile Flash on the same chip.

During normal system operation, the NVSRAM behaves exactly as a standard fast SRAM with on-chip Flash part invisible to users and can be easily interfaced to the existing microprocessors. The NVSRAM constantly monitors its VCC supplied power, and if it detects an event that may cause a loss of VCC power, it automatically stores an exact copy of SRAM's contents to Flash in a single, and extremely fast, simultaneous transaction, usually referred as a "Store" operation. Even in the event that the normal off-chip VCC power is instantaneously removed from the NVSRAM, a claim of using small an external off-chip capacitor provides sufficient power to the device to ensure that all of the SRAM's contents are successfully copied to the Flash on chip accordingly.

When VCC power is restored to the system, the contents of the Flash are then automatically written back to the SRAM, returning the system back to the same state as before the disruption of VCC power. Typically, this process is referred as a "Recall" operation of NVSRAM.

Since the vast majority of repetitive write operations take place with the on-chip SRAM, there is no possibility of memory degradation or wear-out. Without an on-chip SRAM, the 100K P/E endurance cycles of a Flash cell can only withstand more than 25 power interruptions per day over the typical 10-year lifespan of a semiconductor device.

Within the NVSRAM memory chip design today, there is no immediate availability of two strong and stable on-chip HV VPP and LD VCC power supplies required by the "Store" operation upon the sudden loss or removal of an external VCC power supply during the regular SRAM's Read and Write operations.

Despite today's 12T NVSRAM system has one off-chip back-up VCC capacitor, Vcap, but to obtain an on-chip stable HV VPP without a strong powerful Vbat supply to complete a desired "Auto-Store" operation still faces many tough challenges. This is because a sequence of critical and risky steps has to be successfully performed to complete the Auto-Store operation of the NVSRAM memory.

Depending on the NVSRAM design, in one case, the "Auto-Store" operation involves two HV critical steps in sequence such as the first step of a −15V VNN FN-channel erase operation followed by the second step of a +15V VPP FN-channel Program operation. All these operations are guided by the on-chip State-machine design to perform on the large-density NVSRAM's flash cells. All these VPP & VNN pumps and the State-machine circuits consume VCC power that is supplied by either a weak Vcap or a strong Vbat off-chip.

As a result, the Vcap capacitance value becomes very critical. Similarly, constant monitoring Vbat voltage level is also very crucial. For example, according to Cypress' NVSRAM specification, Vcap value more than 100 uF is required. FIG. 4 shows below three packages with Vcap pin as a second back-up VCC at pin30, pin1 and pin36 from left to right for 44-pin TSOP, 48-pin SSOP and 54-pin TSOP packages of the SPI Parallel NVSRAM product. There are two regular first VCC supplies at pin11 and pin33 for 44-pinTSOP, another two regular first VCC supplies at pin25 and pin48 for 48-pinTSSOP and another two first VCC supplies at pin13 and pin 41 for 54-pin TSOP. A Vcap connection is assigned to pin30 in 44-pin TSOP package, to pin1 in 48-pin SSOP package and to pin36 in 64-pin TSOP package for a variety of the Parallel NVSRAM chips.

Similar to a Serial-type NBSRAM, the added Vcap is bulky and costly and the operation of "Auto-Store" takes lengthy delay because of the complicated logic controls for performing both erase and program operation that requires two HV voltages of VPP and VNN that require few ms to charge up to the desired +15V and −15V to whole NVSRAM flash cells' gate with a high capacitance loading.

In summary, today's NVSRAM devices combine the best attributes of SRAM's fast unlimited Read and write cycles and Flash NVM capability retaining data after VCC power loss as an alternative robust and safe data repetitive storage device. But the shortcoming is a need of an off-chip battery, Vbat, or an off-chip VCC back-up capacitor, Vcap, and the complicated timing control sequence that loads a heavy burden on system microprocessor's design. The result is its slower introduction to the market place.

In addition, either Vcap or Vbat approach stores only a LV VCC supply voltage at an external pin. When a regular VCC power loss is detected and NVSRAM switches to connect them, they still provide none of the instant VPP on-chip power supply. It will takes few ms to enable the on-chip oscillator and charge-pump circuits and a complicate State-machine design to provide the control over the Erase and Program operations during the power-down period.

Therefore a cautious constantly monitoring of the Vbat power system is required, that makes the NVSRAM system costly. Plus Vbat battery has another environmental handling issue. Thus, the acceptance in market place declines.

Note, in some flash occasions, the erase and program definition may be reversed. For example, an erase operation is defined to decrease flash cell's Vt by applying a negative HV VNN (−15V) on cell's gate with cell's channel held at ground with a program operation being defined to increase flash cell's Vt by applying a positive HV (+15V) to cell's gate. Conversely, an erase operation is defined to increase flash cell's Vt by applying a positive HV VPP (+15V) on cell's gate with cell's channel held at ground with a program operation being defined to decrease flash cell's Vt by applying a negative HV (−15V) to cell's gate.

In view of above drawbacks of off-chip Vcap and Vbat NVSRAM system designs, it is desired to develop improved techniques in NVSRAM auto-store function upon VCC power loss without complicated state-machine design for VCC power saving with high-yield success.

SUMMARY OF THE INVENTION

The present invention generally relates to a preferred method of using an on-chip HV VPP capacitor and an on-chip LV VCC capacitor as back-up power supply upon VCC power loss with improved efficiency of the low-current VPP program operation for next-generation NVSRAM memory system circuit design.

It is more specifically relates to a faster two preferred on-chip always fully-charged capacitors of VPPcap (or VNNcap) and VCCcap as an alternative +HV VPP (or −HV VNN) and a LV power VCC supplies without using costly and bulky external capacitor or battery via connect pins Vcap and Vbat. If the defined program operation uses a +HV VPP to perform FN-channel program to selectively increase the flash cell's Vt, then the present invention prefers to form two on-chip capacitors of VPPcap and VCCcap as a back-up +HV and LV VCC supplies for an instant program operation. In contrast, if the defined program operation is reversely using −HV VNN to perform the FN-channel program to selectively decrease the Flash cells' Vt, then the present invention prefers to form two on-chip capacitors of VNNcap and VCCcap as a back-up −HV and LV VCC supplies for an instant program operation.

All above said on-chip VPPcap, or VNNcap, and VCCcap capacitors are preferably fully charged at all time, ready for a sudden call to perform the "Auto-Store" program operation during a very time-limited power-down period without another HV erase operation. As a result, only one HV (+HV or −HV) capacitor and one VCCcap are required. Without an erase function in NVSRAM's Auto-Store operation, the present invention becomes like a regular Program operation. Thus, only Program operation is required, and complicated State-machine control sequences and steps can be greatly reduced to one step for VCC power saving with high-yield success.

In an embodiment, the present invention discloses a preferred NVSRAM's "Auto-Store" operation that performs only one single, simple Program operation without an Erase operation, regardless of whether the definition of Program is to increase or decrease flash cells' Vt in NVSRAM memory. In such manner, only one HV of VPP or VNN, rather than both VPP and VNN, will be required in Auto-Store operation, thus saving VCC power consumption under a scenario without the current support from a regular off-chip VCC, Vcap and Vbat supplies.

In another embodiment, the present invention discloses a preferred NVSRAM's "Auto-Store" operation that uses a simple VCC detector to issue instruction to initiate a simple Auto-Store Program operation without Erase, which otherwise would involve a complicated and power-consuming State-machine circuit in order to control the steps.

In yet another embodiment, the present invention discloses a preferred NVSRAM's "Auto-Store" operation by using only on-chip fully charged capacitors VPPcap and VCCcap or VNNcap and VCCcap as the on-chip LV and HV power supply sources with all VNN and VPP pump circuits in a disabled state so that no current draws from VCCcap again since the VCC power loss is detected by on-chip VCC-detector.

In still another embodiment, the present invention discloses preferred on-chip capacitors of VPPcap or VNNcap, and VCCcap made of on-chip top metal layers. The number of top metal layers is preferably flexible, at least varying from one to three, depending on the requirement of the NVSRAM memory density.

In an alternative embodiment, the present invention discloses a method of forming the on-chip capacitors of VPPcap or VNNcap and VCCcap by using the areas of more than tenfold of the respective layout areas of FWL and SG1 on NVSRAM chip so that the charge-sharing of the VPP HV voltage and VCC LV voltage would result in less than 10% for saver Store operation of NVSRAM.

In another alternative embodiment, the present invention is to propose on-chip HV and LV Level-Shifters such as VPPsft and VCCsft consuming very little switching current to retain the stored voltages of VPP and VCC in three respective capacitors of VPPcap and VCCcap.

In yet another alternative embodiment, the present invention provides a method for stopping the oscillator and pump circuit when VCC power is removed and the Auto-Store operation of NVSRAM is initiated.

In still another alternative embodiment, the present invention provides a method for lowering the pump oscillator frequency below 1/10 or more during normal SRAM operation to refresh the VPPcap and VCCcap at low current of less than 10 µA.

In yet still another alternative embodiment, the present invention provides a method for increasing the oscillator frequency to around 2.0 Mhz during normal Software-Store and Hardware-Store operations so that the flash program operation can be done in a faster pace, within 5 ms.

In one more alternative embodiment, the present invention discloses that the capacitance of the MIM layers for VPPcap and VCCcap can be increased by adding more MIM layers with a metal layer inserted in between as a shielding layer to prevent a coupling effect on normal NVSRAM circuits from VPPcap and VCCcap being discharged.

In a specific embodiment, the present invention provides on-chip capacitors for positive high-voltage (HV) and low-voltage (LV) back-up power supply of a NVSRAM memory. The on-chip capacitors include a first conductive material formed on top of a NVSRAM memory chip. The NVSRAM memory chip includes a VDD-power pin drawing a regular VCC power to a LV PMOS device connected to a LV NMOS device and to a HV charge pump device connected to a HV PMOS device. The first conductive material is coupled to a grounded source node of the LV NMOS device. Additionally, the on-chip capacitors include a first insulation material isolated entirely the first conductive material. Moreover, the on-chip capacitors include a second conductive material formed overlying at least a part of the first insulation material. The second conductive material includes a first portion and a second portion separated by another part of the first insulation material. The first portion of the second conductive material is coupled to a drain node of the LV NMOS device connected to a source node of the LV PMOS device. The second portion of the second conductive material is coupled to an output node of the HV charge pump device connected to a drain node of the HV PMOS device. The first conductive material, the first insulation material, and the first portion of the second conductive material form a first on-chip capacitor being charged from the regular VCC power through the VDD-power pin with the LV PMOS device in conduction state and the LV NMOS device in non-conduction state. The first conductive material, the first insulation material, and the second portion of the second conductive material form a second on-chip capacitor being charged from the output node of the HV charge pump device with the HV PMOS device in non-conduction state.

In an alternative embodiment, the present invention provides a method for performing an auto-store operation of a NVSRAM memory chip at a power-loss state. The method includes providing a low-voltage (LV) capacitor and a high-voltage (HV) capacitor formed on-chip over a NVSRAM memory chip including array of NVSRAM cells. Each NVSRAM cell is made by a SRAM cell having two nodes respectively coupled to one paired Flash cell. The method further includes charging the LV capacitor to retain up to a VDD level by coupling to a VCC power line connected to a regular VDD power supply and charging the HV capacitor to retain a VPP level by connecting to a positive HV charge pump circuit powered via the VCC power line. Additionally, the method includes determining a power-loss state associated with the NVSRAM memory chip if the VCC power line connected to the regular VDD power supply is detected to drop below 80% of the VDD level. The method further includes switching the VCC power line to the LV capacitor as a back-up power of up to the VDD level to operate each SRAM cell based on the determined power-loss state. Moreover, the method includes applying the charged VPP level at the HV capacitor to a word line of each paired Flash cell corresponding to each SRAM cell based on the determined power-loss state. The VPP level is at least higher than a programming voltage required for inducing a FN-channel effect to write each SRAM cell logic data in the two nodes into the corresponding paired Flash cell without using any off-chip capacitors and batteries.

In another alternative embodiment, the present invention provides a VCC power system for operating an Auto-Store task of a NVSRAM memory chip. The VCC power system includes a VCC power line connected to an off-chip power supply normally for providing a VDD voltage to a NVSRAM memory chip including array of NVSRAM cells. Each NVSRAM cell is made by a SRAM cell coupled to a paired Flash cell via at least one paired select transistor. The VCC power system further includes a first on-chip capacitor formed on the NVSRAM memory chip. The first on-chip capacitor is charged up to the VDD voltage directly from the VCC power line. Additionally, the VCC power system includes a second on-chip capacitor formed on the NVSRAM memory chip next to the first on-chip capacitor. The second on-chip capacitor is charged to a positive VPP voltage from an output of a high voltage (HV) pump device powered from the VCC power line. The VCC power system further includes a VCC-level shifter including a first input connected to the VCC power line, a second input connected to the second on-chip capacitor, and a third input connected to a VCC detector configured to detect a power-loss state when voltage in the VCC power line drops below 80% of the VDD voltage. Furthermore, the VCC power system includes a VPP-level shifter sharing the first input, the second input, and the third input with the VCC-level shifter and additionally including a fourth input connected to both the second on-chip capacitor and the HV pump device. Moreover, the VCC power system includes a VCC switch sharing the first input, the second input, and the third input with the VCC-level shifter. The power-loss state automatically initiates switching from the first input to the second input for providing the charged VDD voltage from the first on-chip capacitor through the VCC switch to power each SRAM cell in the NVSRAM memory chip and through the VCC-level shifter to make at least the paired select transistor in conduction state connecting each SRAM cell to the corresponding paired Flash cell. The power-loss state also automatically applies the positive VPP voltage from the second on-chip capacitor through the VPP-level shifter to a global word line of the corresponding paired Flash cell to initiate a store operation for writing logic data of each SRAM cell into the corresponding paired Flash cell under a FN-channel scheme without erase operation.

Many benefits can be achieved by applying the novel approach of building two on-chip capacitors of one HV capacitor (VPPcap or VNNcap) and one LV VCC capacitor (VCCcap) as for a back-up second power supplies. All of these preferred HV and LV capacitors can be made of a number of the top MIM layers based on desired capacitance value associated with the NVSRAM density. The capacitor areas of top MIM layers can be flexibly determined by the ratio of layout area between the ratio of VPPcap vs FWL line area and VCCcap vs. top select transistor gate SG1 area in silicon. The ratio is preferably made more than 20 or more to ensure the final voltage to FWL and SG1 are almost no drop after the charge-sharing between VPPcap and FWL and VCCcap and SG1. In addition to VCCcap and VCCcap being carefully planned, the simplified circuit control without a need for a State machine by performing only one Program operation without Erase operation which is configured to perform during the normal SRAM operation rather than during the VCC power-limited Auto-Store operation without using any off-chip Vbat and Vcap.

DETAILED DESCRIPTION OF THE INVENTION

The present invention generally relates to a preferred method to improve the efficiency of the low-current VPP or VNN program operation, depending on the definition of the erase and program operation by using the on-chip HV capacitor and LV VCC capacitor for next-generation NVSRAM memory system circuit design upon VCC power loss.

It is more specifically relates to a faster three preferred on-chip always fully-charged capacitors of VPPcap, VNNcap and VCCcap as an alternative positive high voltage (+HV) or negative high voltage (−HV) and a LV power VCC supplies without using the costly and bulky Vcap and Vbat. If the defined program operation uses a +HV VPP to perform FN-channel program to selectively increase the flash cell's Vt, then the present invention prefers to form two on-chip capacitors of VPPcap and VCCcap as a back-up +HV and LV VCC supplies for an instant program operation. In contrast, if the defined program operation is reversely using −HV VNN to perform the FN-channel program to selectively decrease the Flash cells' Vt, then the present invention prefers to form two on-chip capacitors of VNNcap and VCCcap as a back-up −HV and LV VCC supplies for an instant program operation.

Figure 1:
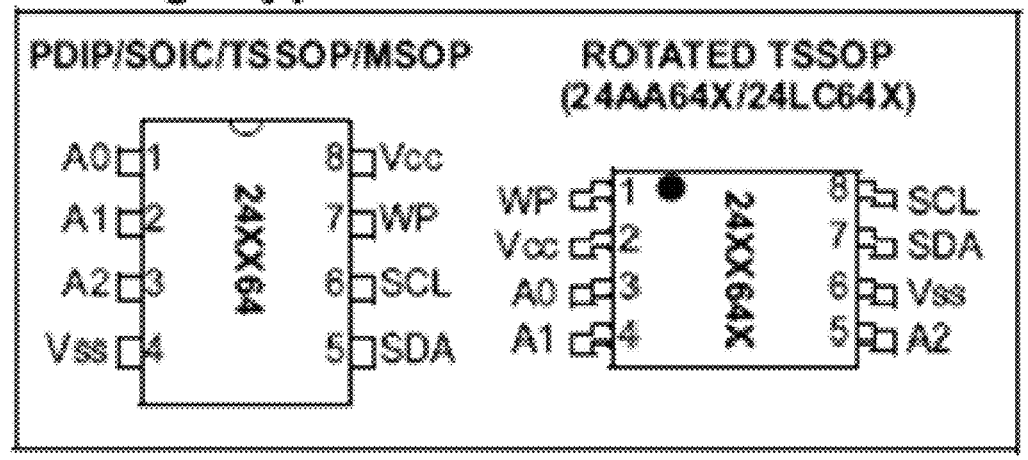
FIG. 1 is a schematic diagram of two conventional 8-pin packages with pin-definition for I2C Serial EEPROM products without Vcap and Vbat pins.
Figure 2:
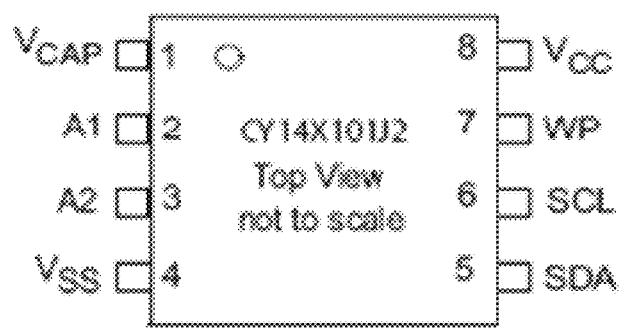
FIG. 2 is a schematic diagram of another conventional 8-pin package with pin1 defined as Vcap along with pin8 still defined as VCC for an I2C Serial NVSRAM product.
Figure 3:
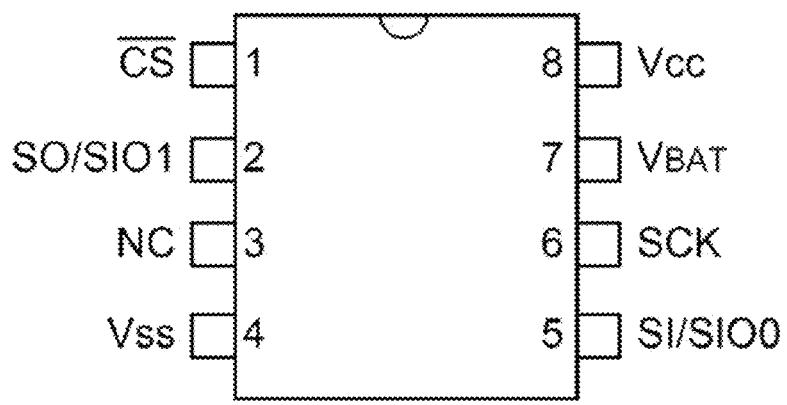
FIG. 3 is a schematic diagram of another conventional 8-pin package with the pin7 defined as VBAT for a SPI Serial NVSRAM product along with pin8 as VCC.
Figure 3:
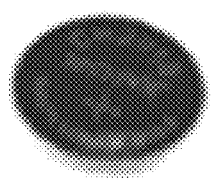
Figure 3:
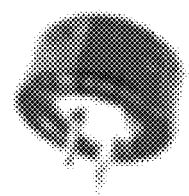
Figure 4:
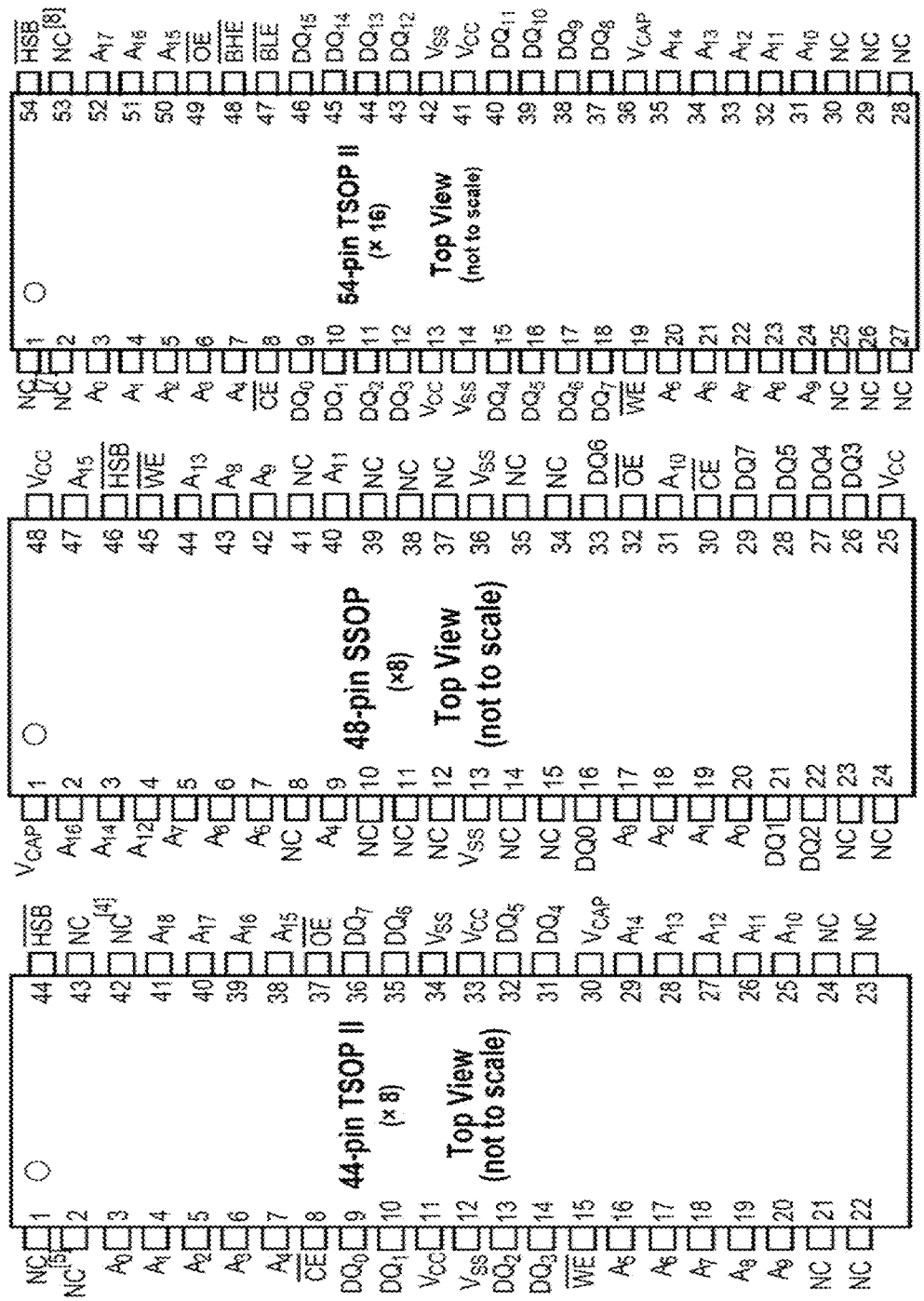
FIG. 4 is a schematic diagram of three conventional packages with Vcap pin as a second back-up VCC at pin30, pin1 and pin36 from left to right for 44-pin TSOP, 48-pin SSOP and 54-pin TSOP packages of the SPI Parallel NVSRAM product.
Figure 5:
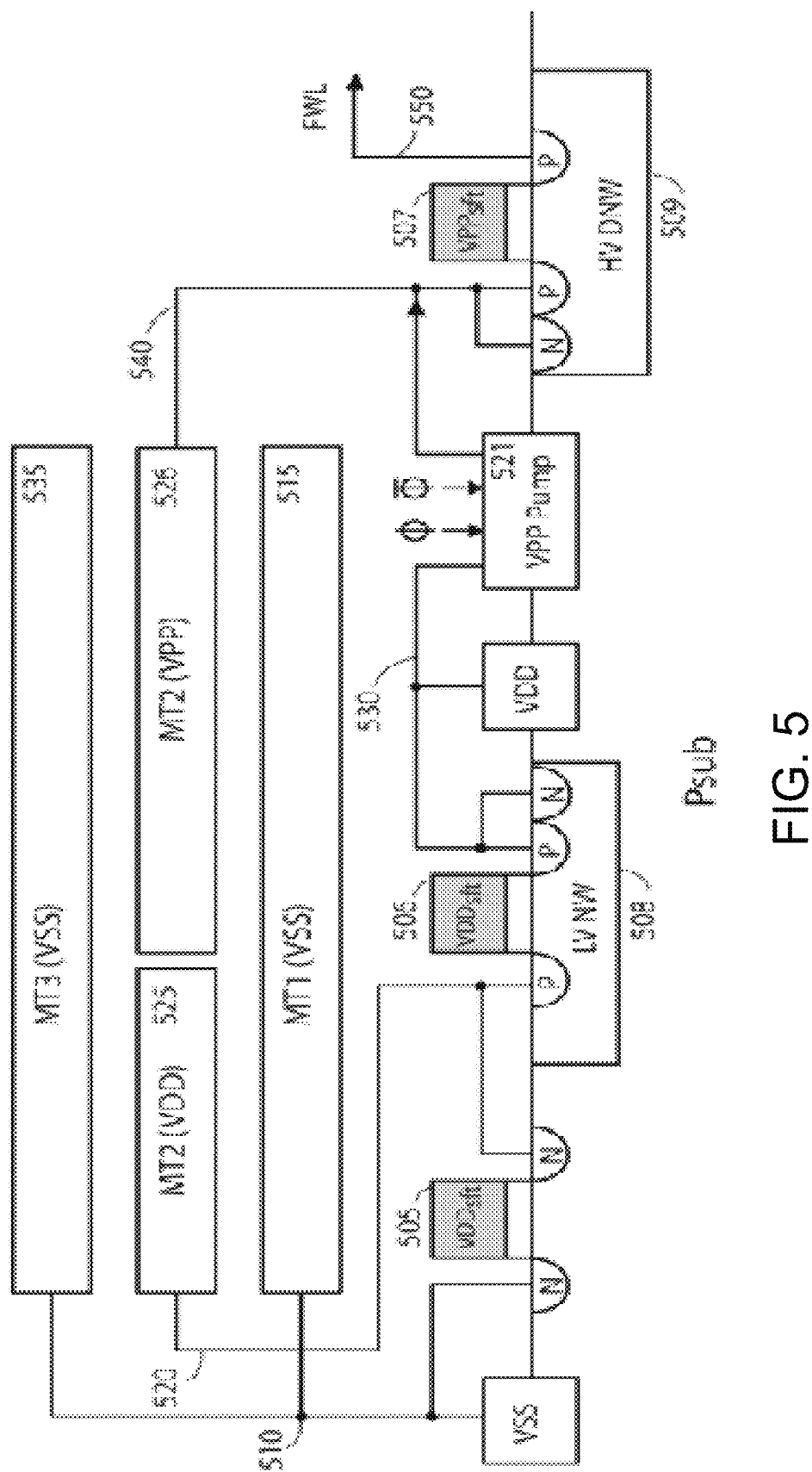
FIG. 5 is a schematic diagram of two preferred MIM capacitors of VPPcap and VCCcap made of MIM layers on top of a NVSRAM memory with same top metals according to an embodiment of the present invention.

FIG. 5 is a schematic diagram of two preferred capacitors of VPPcap and VCCcap made of metal-insulator-metal (MIM) layers on top of a NVSRAM memory with same top metals according to an embodiment of the present invention. This diagram is merely an example, which should not unduly limit the scope of the claims. One of ordinary skill in the art would recognize many variations, alternatives, and modifications. As shown, two preferred MIM capacitors of VPPcap 525 and VCCcap 526 made of three MIM layers are formed on top of a NVSRAM memory with the same top metals for one definition of Program and Auto-Store operation. Alternatively, the metal material in MIM layers can also be replaced by polysilicon. The Store and Program are defined to use the VPP +15V or higher applying to the gates of all corresponding flash cells of the NVSRAM cells on chip.

Both VCCcap 525 and VPPcap 526 metal layers are sandwiched by one top MIM metal layer of 535 and another bottom MIM layer of 515. Both top 535 and bottom 515 MIM layers are connected to a node 510 that is grounded as a shielding layer to VCCcap and VPPCap to the whole NVSRAM circuit placed below.

In this layout structure, the VCCcap and VPPcap have 2-fold of capacitance values. The first 1× capacitor is formed between the VCCcap 525 and VPPcap 526 to the top MIM layer of 535. Similarly, the second 1× capacitor is formed between the VCCcap 525 and VPPcap 526 to the bottom MIM layer of 515. Both should have substantially same value of capacitance. In this way, the advantage of a 2-fold capacitance value can be achieved within the same top area. But the disadvantage is the increase in the MIM layer, thus the manufacturing cost is increased by two extra layers, the top MIM metal and top via contact layer. The average oxide thickness between metal/polysilicon layers is made around 400 Å to sustain at least 15V oxide breakdown in today's foundry technology. This 15V oxide-breakdown specification makes them very suitable for the on-chip VPPcap and VNNcap of the present invention.

Conversely, for a different definition of the FN-channel Program operation using VNN voltage to decrease flash cell's Vt, then the VPPcap shown in FIG. 5 should be replaced by the VNNcap without a change of VCCcap of the present invention.

For a 4-fold capacitance increase in the same area for the VCCcap and VPPcap, two additional top MIM layers can be formed over the layout cross-sectional view shown in FIG. 5. The added first MIM layer of VPPcap and VCCcap can be formed over the top metal layer 535 as current VPPcap 525 and VCCcap 526. On top of that, a second MIM layer of VCCcap and VPPcap and another top metal layer can be added to cover the entire MIM layers so that the 4-fold capacitance increase is made. Further capacitor increase can be added in the same manner if it is necessary.

The LV NMOS device 505 and LV PMOS device 506 are to show the last stage of an on-chip VDD power supply circuit using a preferred VCCsht design switch circuit along with the on-chip capacitor VCCcap 525. The output node 520 of the LV PMOS device 506 shows a connection to the VCCcap of 525. The drain node of the LV PMOS device 506 is connected to VDD node 530 which is the first VCC external supply pin (a conventional power supply pin). The LV PMOS device 506 is associated with a LV N-well 508 within a Psub.

FIG. 5 also shows, although no detailed circuit connection of the switch circuit VCCsft is shown, that the VCCcap 525 is fully charged to a first VCC=VDD voltage during the normal NVSRAM operation or SRAM Read and Write operation through the LV PMOS device 506 of the VCCsft switch circuit. In other words, during normal stable supply of the first VCC voltage for a NVSRAM operation, the gate of the LV PMOS device 506 is grounded to make the PMOS device 506 in conduction state but the gate of LV NMOS device 505 is grounded also to prevent VCCcap 525 charge leakage from node 520 to ground node 510. The gate of the LV PMOS device 506 and gate of NMOS device 505 have separated controls but both remain being grounded in regular NVSRAM operation when the first VCC voltage remains stable for regular SRAM Read and Write or Software- and Hardware-Store operations.

Upon detection of power loss of the first VCC voltage at node 530, the NVSRAM's "Auto-Store" operation is initiated immediately, thus the gate of LV PMOS device 506 has to be coupled to node 530 to stay in a back-biased condition so that a fully charged VCC voltage in VCCcap 525 can be trapped and sustained without being discharged by the dropping of the first VCC voltage. During the power-down period, the gate of the LV NMOS device 505 has to remain grounded.

In a specific embodiment, the advantages and functions of the two on-chip capacitors are illustrated in more details by an exemplary 12T NMOS NVSRAM circuit (see FIG. 6A below) in accordance with the present invention. Referring to both FIG. 5 and FIG. 6A, SG1 gate of 3T Flash Strings of a 6T HV Flash cell in the NVSRAM cell circuit will be connected to the VCCcap node 520 upon the first VCC power loss within a few ns. The initial voltage of SG1 is at VSS level to isolate the 6T HV Flash cell from the 6T LV SRAM cell during the normal SRAM's Read and Write operations. But upon the power loss of the first VCC power supply, the SG1 is switched to connect to the secondary on-chip VCC supply, i.e., VCCcap 525, which is made by connecting the gate of LV PMOS device 506 to the node of 530. The gate voltage of the LV PMOS device 506 after power loss is preferably maintained one of the same voltage at VDD node 530 by the control circuit. Practically, the gate voltage of LV PMOS device 506 can be easily designed to be trapped with one Vtp level so that the LV PMOS device 506 would remain off to protect the charges in the capacitor VCCcap 525 from leakage due to power-off at node 530.

During the normal Software-Store or Hardware-Store and the regular SRAM operations, the gate voltage of the LV PMOS device 506 is always kept at VSS level to constantly charge the capacitor VCCcap 525 by the first VCC (=VDD) power supply at node 530, referring to FIG. 5. Similarly, the other capacitor VPPcap 526 is always being charged to a full VPP voltage of +15V or higher by a VPP pump circuit 521 through the connection of 540. The gate voltage of the HV PMOS device 507 is normally connected to VDD to shut off the connection between flash's gate voltage of FWL 550 and the VPPcap 526 during SRAM regular operation. The HV PMOS device 507 is associated with a HV deep N-well 509 within the same Psub.

In a specific embodiment, if +15V is preferably defined as for the FN-channel Program operation of the NMOS NVS-RAM cell to increase 2-poly NMOS flash cell's Vt, the MIM capacitor 526 is designated for the VPPcap. Conversely, if −15V (via a negative VNN pump circuit) is preferably defined as for the FN-channel Program operation of NVSRAM to decrease 2-poly NMOS flash cell's Vt, then the MIM capacitor 526 is designated for the VNNcap. In the present invention, either VPPcap or VNNcap is used. But neither is used at the same time because only one HV operation is preferably performed during the power-off period.

Before power-down period, the VPPcap voltage is refreshed by a low-frequency clock oscillator of the VPP pump circuit 521. The frequency Φ is preferably defined as following table,

| Frequency | SRAM Read & Write operation | Software-Store | Hardware store | Auto-store |
|---|---|---|---|---|
| Φ | ≤1/10 of F1 | F1 | F1 | Zero | where Φ F1 is ranged from 2 to 10 Mhz, 1/10 of F1 is 0.2 to 1 Mhz.

The reason for the above frequency setup is explained below.

a) During the normal SRAM operation, there is no need for high voltage, thus the frequency Φ of the VPP pump oscillator can be drastically reduced to below 1/10 of the normal frequency F1 to save power. In this period, the VPPcap 526 is constantly charged to refresh the VPPcap voltage to keep it at full VPP voltage of +15V or VNN voltage of −15V. In certain embodiments, a frequency of 1/30 to 1/100 of F1 is possible to maintain the VPP and VNN voltage without a drop due to junction leakage in the circuits of VPPsft. This low-frequency refreshing current draws VDD power from a normal first off-chip VCC supply at node 530 connected to the external pin.

b) During the power-off operation, there are no more off-chip VCC, Vcap and Vbat supplies in the present invention. Instead, the VPP or VNN voltage receives support from an on-chip capacitor VPPCap or VNNcap. Therefore, the Φ pump oscillator is stopped with zero frequency. Under this power-off period of the present invention, the pump and oscillator circuits would preferably not draw any power from the whole back-up VCCcap and the first regular VCC supply pin.

c) But during the Software-Store and Hardware-Store operation, the VCC supply pin connected to node 530 is under a stable condition. Therefore, the VCC supply current is strong and steady, thus either the VPP pump or VNN pump can be run at higher frequency without any problem in shortening the time to achieve VPP of +15V and VNN of −15V respectively for fast Program and Erase operation within 5 ms because FWL capacitive loading is more than 500 pf in the high-density NVS-RAM memory greater than 1 Mb.

As a summary, the on-chip oscillator's frequency for VPP and VNN pumps can be flexibly adjusted in accordance with the requirements of the different operations. It preferably cuts down the pump frequency to at least below 1/10 or more to consume the refreshing VCC current to less than 10 μA during the normal SRAM operation, and stops to consume zero VCC or Vcap current when the regular power VCC is removed.

Figures 6A, 6B:
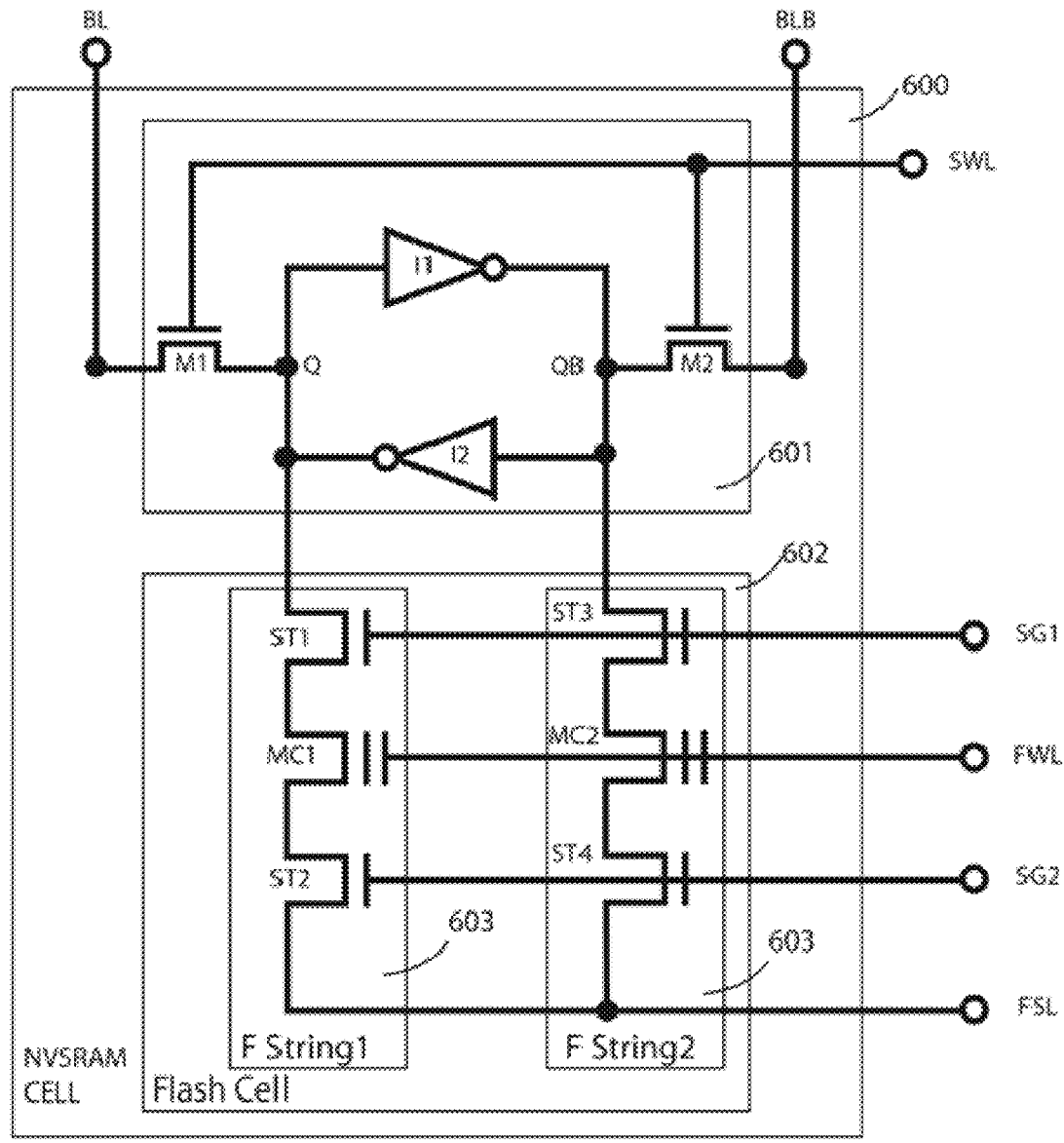
FIG. 6A is a circuit diagram of an exemplary 12T NMOS NVSRAM cell that is benefited from incorporating two on-chip HVcap and LVcap according to a specific embodiment of the present invention.
FIG. 6B is a table that discloses a set of biased conditions for key Erase, Program and Program-Inhibit operations for the exemplary 12T NMOS NVSRAM cell shown in FIG. 6A.

FIG. 6A is a circuit diagram of an exemplary 12T NMOS NVSRAM cell that is benefited from incorporating two on-chip HVcap and LVcap capacitors in accordance with the present invention. As shown, a NMOS, 2-poly, 12T NVS-RAM cell 600 includes one LV 6T SRAM cell 601 with Q and QB paired nodes of two Inverters, I1 and I2, and one HV 6T NMOS 2-poly Flash circuit cell 602 with one paired 2-poly 3T NMOS flash strings, FString1 and FString2, denoted as 603, one paired sourceline denoted as FSL along with three common gates, SG1, FWL and SG2. Other NVSRAM cells can also be used to form an on-chip VPPcap or VNNcap and VCCcap as long as the Program and Erase operations are using the low-current FN-channel tunneling scheme and SBPI for Program-Inhibit operation.

FIG. 6B is a table that discloses a set of biased conditions for Erase, Program and Program-Inhibit operations for the exemplary 12T NMOS NVSRAM cell shown in FIG. 6A. During a regular LV SRAM operation as shown in a table below, the Flash cell 602 is invisible to SRAM cell 601, thus the SG1 is connected to VSS to make ST1 and ST3 in a shut-off state. SRAM word line SWL is in VDD for the SRAM operation.

|  | SWL | SG1 | FWL | SG2 | FSL | Φ |
|---|---|---|---|---|---|---|
| SRAM operation | VDD | VSS | VSS | VSS | VSS | ≤1/10 F1 |
| Auto-store | VSS | VSS -> VDD | VSS -> VPP | VSS | VSS | Zero |
| Hardware-store | VSS | VSS -> VDD | VSS -> VPP | VSS | VSS | F1 |
| Software-store | VSS | VSS -> VDD | VSS -> VPP | VSS | VSS | F1 |

The Erase and Program condition can be defined reversely to increase or decrease flash cell's Vt. But nevertheless, the preferred erase and program operations use FN-channel scheme that consumes very little current per cell such as 1 nA to allow the usage of on-chip fully-charged VPPcap or VCCcap as the second HV power supply when VCC (=VDD) power is removed and pumps are stopped to save power for a simple "Auto-Store" operation. In FIG. 6B, the FN-channel Erase operation is defined to decrease flash cell's Vt, and FN-channel Program operation is to increase flash cell's Vt. The writing of each SRAM's logic state into each Flash pair is defined as the so-called "Auto-Store" operation of the NVSRAM memory. Thus this "Auto-Store" operation just needs an input VPP or VNN HV voltage (for example, +15V or −15V) applied to the Flash gate which is termed as FWL in an embodiment of the present invention with the Flash cell being made by 2-poly NMOS floating-gate transistor. The other input is to charge up SG1 from VSS to VDD.

In an embodiment of this invention, only the select gate control SG1 is required VCC (=VDD) to have a conductive path from the SRAM cell to the Flash cell and the flash gate control FWL is required a high voltage VPP to program each SRAM logic data into each Flash cell. As a result, this 12T NMOS NVSRAM cell can benefit from the on-chip capacitors of VPPcap or VNNcap and VCCcap without relying on off-chip VCC pin, Vcap and Vbat. The VPP voltage would be +15 V or higher if the Flash cell is made by paired 2-poly NMOS floating-gate transistor. The VPP voltage would be just +10V if the Flash cell is made by paired 1-poly SONOS/MONOS charge-trapping transistor. In both cases above the program (or store) operation would result in increase of threshold levels of the paired flash transistor. Alternatively for a 12T PMOS NVSRAM cell, the VPP voltage would be +15V or higher if the Flash cell is made by paired 2-poly PMOS floating-gate transistor. But the program (store) operation would lead to decrease of the threshold levels of the paired flash transistor.

Three kinds of on-chip capacitors of VPP, VNN and VCC are preferably fully charged all the time before power loss by refreshing on the on-chip VPPcap at 1/10 of regular pump frequency of F1. Once the VCC power loss is detected, the VPPcap is immediately connected to the global FWL through the VPP level-shifter, VPPsft, and a VCCcap voltage is charged to the global SG1 to make the top select transistor in on-state and SRAM VCC global lines through an on-chip VCCcap switch. The original VCC power line of SRAM cells and SG1 driver has to be disconnected from the dropping VCC to avoid being pulled down. The SG2 and FSL all remain VSS to keep the bottom select transistor in off-state before and after power-down, thus they do not draw any charges from VCCcap. In other words, a successful Auto-Store operation without using Vcap and Vbat of the NVSRAM operation is using the on-chip fully-charged VCCcap and VPPcap. Only one big capacitive signal SG1 draws VCC LV charges and only one big capacitive signal FWL line draws VPP or VNN HV charges. As a result, a reliable Auto-Store operation can be achieved without a delay to initiate pump circuit and oscillator and Vcap and Vbat.

Figure 7:
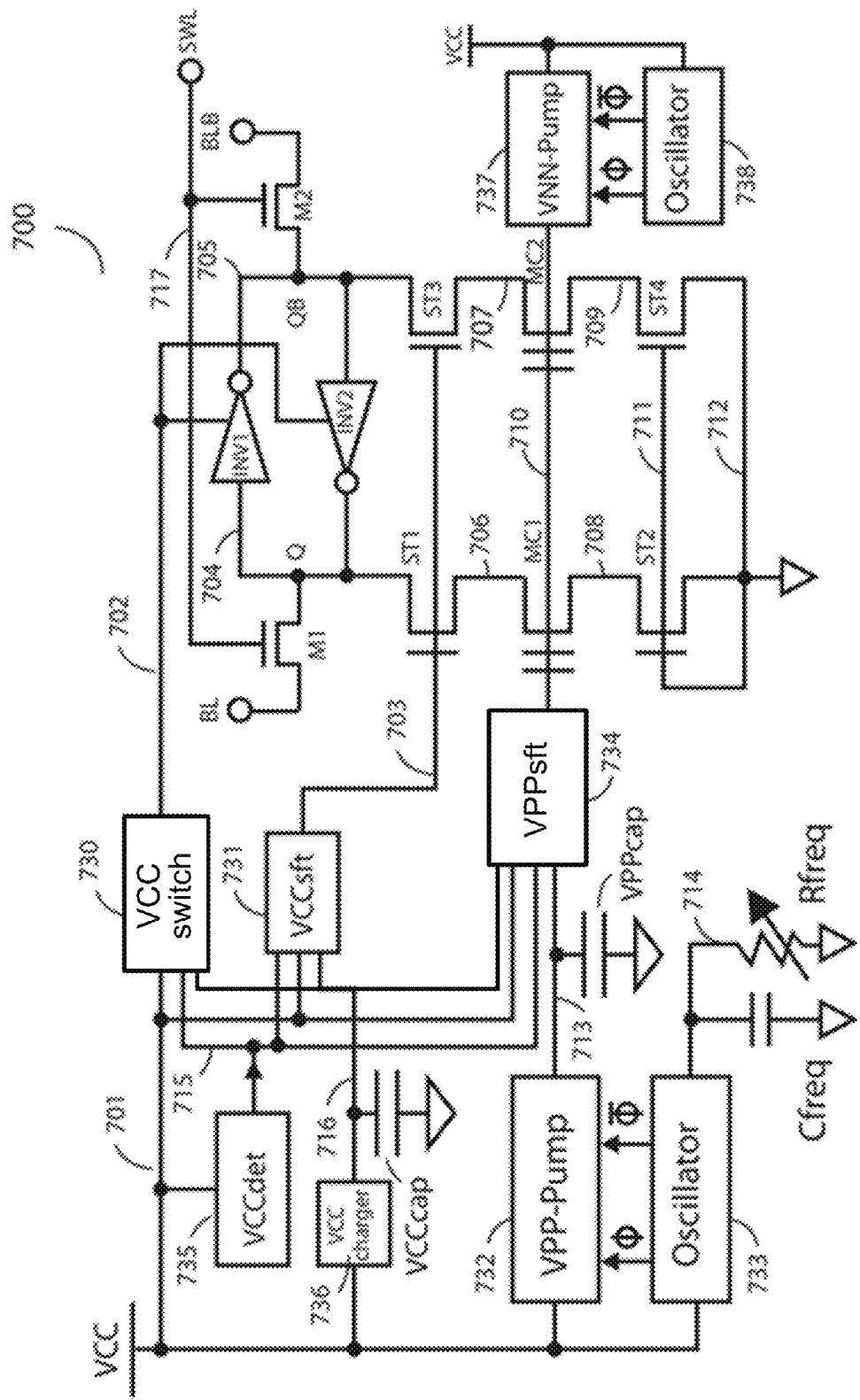
FIG. 7 is circuit diagram of two preferred on-chip capacitors of VPPcap and VCCcap and their associated buses plan and the switching transistors according to an embodiment of the present invention.

FIG. 7 is circuit diagram of two preferred on-chip capacitors of VPPcap and VCCcap and their associated buses plan and the switching transistors according to an embodiment of the present invention. This diagram is merely an example, which should not unduly limit the scope of the claims. One of ordinary skill in the art would recognize many variations, alternatives, and modifications. As shown, a preferred VDD/VCC power supply system 700 including on-chip capacitors of VPPcap and VCCcap and their associated buses plan for operating a NVSRAM's "Auto-Store" task under no supplies of off-chip VDD. The SRAM cell's word line SWL connects at gate node 717 for both 1-poly transistor M1 and M2 respectively coupled their input nodes to bit lines BL and BLB. The two output nodes Q and QB of two Inverters INV2 and INV1 connect via two top 1-poly select transistors ST1 and ST3 to two flash transistors MC1 and MC2 in two flash strings. Another two bottom 1-poly select transistors ST2 and ST4 optionally are coupled between source node of each flash transistor and a flash source line 712 (here is grounded to VSS).

The system 700 includes switching transistors such as VCCsht 731, VPPsht 734 and VCC switch 730 for enabling the NVSRAM's "Auto-Store" operation. When the definition of Erase and Program is reversed, then the VPPcap and its associated bus plan can be replaced by VNNcap and its associated circuits. In other words, the VPP voltage charged into the VPPcap would be a negative HV, for example, a −15V or higher for storing the SRAM cell logic data into the Flash cell by decreasing the threshold level of transistor which is made by a 2-poly NMOS floating-gate transistor. In following sections, only positive HV is used for VPPsht 734.

As seen, there are two major on-chip second power supplies such as one VPPcap and one VCCcap. The VPPcap is connected to the output node 713 of the VPP pump 732. The VCCcap is connected to the output node 716 of the VCC charger 736. The VPPcap supplies the +15V or higher HV VPP-level charges and VCCcap supplies the LV VCC-level charges. The VCC voltage depends on the original off-chip power VCC supply voltage. If the off-chip VCC supply is 3V, then the on-chip VCCcap stores 3V all the time through the VCC charger 736.

Although a detailed circuit of the VCC charger 736 is not shown, it can simply include a big NMOS diode made of an intrinsic device with a small Vt0 such as +0.2V but with a large channel width and smallest channel length. The gate and drain of these intrinsic devices can be tied together and connected to VCC pin 701. In this manner, the VCC charger 736 automatically draws the VCC current and charges the on-chip VCCcap at node 716 all the time without any control circuit that might causes delay and drawing of another VCC current. Although VCCcap voltage is not 100% of VCC, if VCC is 3V, then VCCcap voltage is around 2.7V, which is like a trapped VCC supply.

When VCC at node 701 is being removed and the voltage discharged to VSS, the trapped 2.7V at node 716 would not be leaked away to node 701.

Referring to FIG. 7, a first input of the VCCsft circuit 731 is connected to VCC power line (node) 701. A second input of the VCCsft circuit 731 is connected to the VCCcap output 716. A third input 715 of VCCsft 731 is connected to a control circuit from a VCC detector, VCCdet 735, that monitors the VCC voltage level at node 701 all the time during the normal NVSRAM operation. When VCC voltage drops below a predetermined voltage such as 80% of VCC (=VDD), then it takes control to switch the connection of 703 from VCC 701 to VCCcap output 716.

The VCCsft 731 should have the following functions in accordance with the present invention. For regular SRAM operation, select gate line 703 SG1 is set to VSS to shut off connections 706 and 707 between the SRAM cell and Flash cell as no Flash cell operation is needed and no HV signal is needed. For other operations, the select gate line 703 SG1 is set to VCC (or VDD if regular power supply is on) to make the connection between SRAM cell and Flash cell. During a power loss situation, VCCsft 731 switch the connection from the first input to the second input to connect VCCcap which has been charged to VCC (or up to the regular VDD level) all time. Now the ST1 and ST3 is controlled by the back-up power supplied from charged VCCcap to allow auto-store operation through the path 706 and 707.

| Operation | Auto-Store | Software-store | Hardware-store | Recall | SRAM |
|---|---|---|---|---|---|
| VCCsht (703 = SG1) | VCC | VCC | VCC | VCC | VSS |
| LV supply | VCCcap | VCC | VCC | VCC | VCC |

Similarly, the VPPcap is always kept fully charged at a VPP voltage by a VPP pump circuit 732 (no detailed circuit is shown). This is done by keeping the pump oscillator 733 running all the time with a frequency control circuit at node 714. The clock Φ frequency is controlled by a fixed capacitor Cfreq and one variable resistor Rfreq. The detailed circuit of how to adjust the frequency can be referred to prior art and would not be discussed here for description brevity. As explained above, during regular SRAM operation, the Φ frequency is preferably lowered to below the normal frequency of 1/10 F1 when Software- and Hardware-Store operations are performed during the stable VCC operation.

Referring to FIG. 7, the VPPsft 734 also shares the above three inputs with the VCCsft 731 as well as the VCC switch 730. In addition, the VPPsft 734 includes a fourth input connected to output node 713 of the VPP pump 732 as well as the on-chip HV capacitor VPPcap. Although no detail is shown in the VPPsft 734, it should include only HV PMOS device to control the application of positive +HV VPP voltage to a global word line 710 of the flash transistors MC1 and MC2 of the 6T Flash cell for store operation to program SRAM logic data into the Flash cell.

| Operation | Auto-Store | Software-store | Hardware-store | Recall | SRAM |
|---|---|---|---|---|---|
| VPPsht 710 = FWL | VPP | VPP | VPP | VCC | VSS |
| HV supply | VPPcap | VPP pump | VPP pump | VCC | Don't care |

FIG. 7 shows that optionally the power supply system 700 includes another VNN pump 737 with its oscillator 738 without a VNNcap for providing a negative –HV VNN voltage also to the global word line 710 of the paired flash cells MC1 and MC2 for regular erase operation under FN-channel scheme. The VNN pump 737 and oscillator 738 normally are also powered by connecting to regular VCC line 701. In a specific embodiment, FIG. 7 shows the Program operation using +HV VPP only, thus it needs an on-chip VPPcap and VCCcap, and does not need VNNcap for Auto-Store operation. In order to avoid current shorting with VPPsft 734 when the –HV is supplied into the word line 710, the VPPsht 734 contains no NMOS device. But in Software-Store and Hardware-Store operations of NVSRAM, both VNN and VPP pumps running at higher frequency of F1 is needed because VCC supply is stable and strong.

During the Auto-Store operation, all VPP and VNN pumps are immediately stopped, thus Φ=0. At the same time, VCCsft 731 acts to switch from the first input to the second input to draw VDD level charge and supply in line 703 to the select gate SG1 for turning ST1 and ST3 in conduction state. The power supply of SRAM's two Inverters of INV1 and INV2 are connected to node 702 and to a VCC switch circuit 730. Upon the VCC power loss at node 701, the VCCdet 735 will shut off the connection between node 702 and node 701 to keep node 702 from leakage for normal SRAM operation. Node 702 now is able to draw power from VCCcap from node 716 via VCC switch 730 to provide back-up power for the SRAM cell. Upon the VCC power loss at node 701, VPPsft 734 acts automatically to apply the charged positive VPP voltage in VPPcap to the word line 710 of the Flash cells MC1 and MC2. The VPP voltage is sufficiently high to induce FN-channel effect to increase threshold levels of the paired flash transistors no matter what their original threshold levels are but maintain their threshold level difference. No erase operation is needed as the threshold level of the flash transistor does not need to set to low as in regular NVSRAM operation. As a result of the power-loss state, an auto-store operation is triggered with all above processes such that the SRAM logic data saved in two nodes Q and QB is stored respectively into the paired flash transistors MC1 and MC2 with the same logic polarity. This preferred auto-store operation requires only the back-up power supply from the charged VDD voltage from VCCcap and charged +HV VPP voltage from VPPcap to program once without erase operation. The whole process is operated without any off-chip power supply via Vcap or Vbat pins.

During the normal SRAM operation, the capacitance associated with node 702 is fully charged to VCC voltage by drawing the VCC current from node 701 through VCC switch 730. Once the VCC 701 is removed, then SRAM VCC is supported from the parasitic big capacitance at node 702 because VCCsft 731 preferably disconnects node 702 from node 701, this circuit of which has been omitted without affecting the spirit of the invention.

Although the above has been illustrated according to specific embodiments, there can be other modifications, alternatives, and variations. In some examples, the present invention is applied to a 12T NMOS 2-poly NVSRAM cell as shown in FIG. 6A. But it should be pointed out, the present invention should be applicable to other NVSRAM cells and arrays. For example, the NVSRAM cell can be a 10T NMOS NVSRAM cell with two bottom select transistors removed. The NVSRAM cell can also be a 8T NMOS NVSRAM cell with both top and bottom select transistors removed without affecting the application of using the on-chip capacitors as back-up power supply for initiating NVSRAM auto-store operation without erase during a power-off period without using any off-chip power supply. Additionally, no matter the 12T NVSRAM cell, 10T NVSRAM cell, and 8T NVSRAM cell, the flash cell therein can be selected to be either a 2-poly NMOS floating-gate transistor, a 2-poly PMOS floating-gate transistor, or a 1-poly SONOS or MONOS charge-trapping transistor. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. On-chip capacitors for positive high-voltage (HV) and low-voltage (LV) back-up power supply of a NVSRAM memory, the on-chip capacitors comprising:
   a first conductive material formed on top of a NVSRAM memory chip, the NVSRAM memory chip including a VDD-power pin drawing a regular VCC power to a LV PMOS device connected to a LV NMOS device and to a HV charge pump device connected to a HV PMOS device, the first conductive material being coupled to a grounded source node of the LV NMOS device;
   a first insulation material isolated entirely the first conductive material;
   a second conductive material formed overlying at least a part of the first insulation material, the second conductive material including a first portion and a second portion separated by another part of the first insulation material, the first portion of the second conductive material being coupled to a drain node of the LV NMOS device connected to a source node of the LV PMOS device, the second portion of the second conductive material being coupled to an output node of the HV charge pump device connected to a drain node of the HV PMOS device;

wherein the first conductive material, the first insulation material, and the first portion of the second conductive material form a first on-chip capacitor being charged from the regular VCC power through the VDD-power pin with the LV PMOS device in conduction state and the LV NMOS device in non-conduction state;

wherein the first conductive material, the first insulation material, and the second portion of the second conductive material form a second on-chip capacitor being charged from the output node of the HV charge pump device with the HV PMOS device in non-conduction state.

2. The on-chip capacitors of claim 1 wherein the NVSRAM memory chip comprises an array of NVSRAM cells, each NVSRAM cell comprises a SRAM cell coupled to a Flash cell having at least a pair of flash transistors made by either 2-poly NMOS floating-gate transistors, a 1-poly SONOS or MONOS charge-trap transistors, or a 2-poly PMOS floating gate transistors.

3. The on-chip capacitors of claim 1 wherein the first conductive material is either a metal material or a polysilicon material formed on entire layout area above a top metal layer of the NVSRAM memory chip isolated by a part of the first insulator material.

4. The on-chip capacitors of claim 1 wherein the first portion of the second conductive material and the second portion of the second conductive material are formed on substantially a same level over the first conductive material with a part of the first insulation material in between, the second conductive material being either a metal material or a polysilicon material.

5. The on-chip capacitors of claim 1 wherein the first portion of the second conductive material is formed on entire layout area above a top metal layer of the NVSRAM memory chip isolated by a part of the first insulation material and under the first conductive material with another part of the first insulation material in between, and the second portion of the second conductive material is formed over the first conductive material with yet another part of the first insulation material in between.

6. The on-chip capacitors of claim 1 further comprising one or more third conductive materials and one or more fourth conductive materials isolated by one or more second insulation materials formed entirely overlying the second conductive material formed overlying at least a part of the first insulation material overlying the first conductive material, the one or more third conductive materials being electrically coupled to the first conductive material being grounded, and the one or more fourth conductive materials including two electrically isolated portions respectively coupled electrically to the first portion and the second portion of the second conductive material for enhancing the first on-chip capacitor from a first capacitance to a second capacitance and enhancing the second on-chip capacitor from a third capacitance to a fourth capacitance.

7. The on-chip capacitors of claim 2 wherein the first on-chip capacitor is charged all time up to a VDD level whenever the regular VCC power at the VDD-power pin is stably supplied with the VDD level for operating the NVSRAM memory chip.

8. The on-chip capacitors of claim 7 wherein the first on-chip capacitor being charged all time is ready for providing a LV back-up power up to the VDD level whenever a power-loss state is detected as the VCC power at the VDD-power pin drops below 80% of the VDD level.

9. The on-chip capacitors of claim 8 wherein the LV back-up power up to the VDD level is provided to each SRAM cell and optionally to a control gate of select transistors between the SRAM cell and corresponding Flash cell in the NVSRAM memory chip for initiating in an Auto-Store operation to program a logic data in the SRAM cell to the corresponding Flash cell.

10. The on-chip capacitors of claim 2 wherein the second on-chip capacitor is constantly charged to a HV from the HV charge pump device that is refreshed at a selected frequency by an oscillator powered by the regular VCC power from the VDD-power pin, the HV being substantially a positive VPP voltage sufficient for operating NVSRAM program and erase operation.

11. The on-chip capacitors of claim 10 wherein the selected frequency is in a range of 0.2-1 Mhz or lower for consuming less than 10 µA VCC current from the VDD-power pin for any regular NVSRAM operations without need a high voltage.

12. The on-chip capacitors of claim 10 wherein the selected frequency is in a range of 2-10 Mhz for perform regular NVSRAM program and erase operation in about 5 ms.

13. The on-chip capacitors of claim 10 wherein the selected frequency is zero to stop the HV charge pump device whenever a power-loss state is detected as the VCC power at the VDD-power pin drops below 80% of the VDD level.

14. The on-chip capacitors of claim 13 wherein the second on-chip capacitor is ready at the power-loss state for providing a HV back-up power up to the positive VPP voltage through the HV PMOS device coupled to a word line of corresponding Flash cell.

15. The on-chip capacitors of claim 14 wherein the positive VPP voltage is about +15V or greater for increasing/decreasing Flash cell threshold level during a store operation under FN-channel scheme without erase operation, provided that each Flash cell in the NVSRAM memory chip is made by HV 2-poly floating-gate NMOS/PMOS transistors.

16. The on-chip capacitors of claim 14 wherein the positive VPP voltage is about +10V or greater for increasing Flash cell threshold level during a store operation under FN-channel scheme without erase operation, provided that each Flash cell in the NVSRAM memory chip is made by HV 1-poly charge-trapping SONOS or MONOS transistors.

17. A method for performing an auto-store operation of a NVSRAM memory chip at a power-loss state, the method comprising:

providing a low-voltage (LV) capacitor and a high-voltage (HV) capacitor formed on-chip over a NVSRAM memory chip including array of NVSRAM cells, each NVSRAM cell being made by a SRAM cell having two nodes respectively coupled to one paired Flash cell;

charging the LV capacitor to retain up to a VDD level by coupling to a VCC power line connected to a regular VDD power supply;

charging the HV capacitor to retain a VPP level by connecting to a positive HV charge pump circuit powered via the VCC power line;

determining a power-loss state associated with the NVSRAM memory chip if the VCC power line connected to the regular VDD power supply is detected to drop below 80% of the VDD level;

switching the VCC power line to the LV capacitor as a back-up power of up to the VDD level to operate each SRAM cell based on the determined power-loss state;

applying the charged VPP level at the HV capacitor to a word line of each paired Flash cell corresponding to each SRAM cell based on the determined power-loss state, the VPP level being at least higher than a programming voltage required for inducing a FN-channel effect to write each SRAM cell logic data in the two nodes into the corresponding paired Flash cell without using any off-chip capacitors and batteries.

18. The method of claim 17 wherein providing the LV capacitor and the HV capacitor comprises adding one or more metal-insulator-metal (MIM) layers overlying exiting top metal layer for the NVSRAM memory chip with an necessary thickness of insulation material in between.

19. The method of claim 17 wherein charging the LV capacitor comprises maintaining the VDD level all time whenever the power-off state is not detected by the VCC detector.

20. The method of claim 17 wherein switching the regular VCC power line to the LV capacitor based on the determined power-loss state comprises disconnecting the SRAM cell from the regular VCC power line, connecting from the two nodes of each SRAM cell to corresponding paired Flash cell to be conductive, and disconnecting the paired Flash cell to flash source lines.

21. The method of claim 17 wherein charging the HV capacitor comprises retaining the VPP level constantly by refreshing the positive HV charge pump circuit with a selected frequency set by an oscillator powered by the regular VDD power supply through the VCC power line.

22. The method of claim 21 wherein the selected frequency during regular SRAM operations without need of HV is set to 1/10 or smaller of a nominal pump frequency for other operations of the NVSRAM memory chip that need HV.

23. The method of claim 21 wherein applying the charged VPP level based on the determined power-loss state further comprises stopping the charge pump circuit and the oscillator with the selected frequency set to zero.

24. The method of claim 23 wherein the charged VPP level is at least +15V ready for increasing/decreasing threshold levels of each paired Flash cell made by HV 2-poly floating-gate NMOS/PMOS transistors for operating a NVSRAM store operation under a FN-channel scheme without erase operation.

25. The method of claim 23 wherein the charged VPP level is at least +10V ready for increasing threshold levels of each paired Flash cell made by HV 1-poly charge-trapping SONOS/MONOS transistors for operating a NVSRAM store operation under a FN-channel scheme without erase operation.

26. A VCC power system for operating an Auto-Store task of a NVSRAM memory chip, the VCC power system comprising:

a VCC power line connected to an off-chip power supply normally for providing a VDD voltage to a NVSRAM memory chip including array of NVSRAM cells each made by a SRAM cell coupled to a paired Flash cell via at least one paired select transistor;

a first on-chip capacitor formed on the NVSRAM memory chip, the first on-chip capacitor being charged up to the VDD voltage directly from the VCC power line;

a second on-chip capacitor formed on the NVSRAM memory chip next to the first on-chip capacitor, the second on-chip capacitor being charged to a positive VPP voltage from an output of a high voltage (HV) pump device powered from the VCC power line;

a VCC-level shifter including a first input connected to the VCC power line, a second input connected to the second on-chip capacitor, and a third input connected to a VCC detector configured to detect a power-loss state when voltage in the VCC power line drops below 80% of the VDD voltage;

a VPP-level shifter sharing the first input, the second input, and the third input with the VCC-level shifter and additionally including a fourth input connected to both the second on-chip capacitor and the HV pump device;

a VCC switch sharing the first input, the second input, and the third input with the VCC-level shifter;

wherein the power-loss state automatically initiates switching from the first input to the second input for providing the charged VDD voltage from the first on-chip capacitor through the VCC switch to power each SRAM cell in the NVSRAM memory chip and through the VCC-level shifter to make at least the paired select transistor in conduction state connecting each SRAM cell to the corresponding paired Flash cell, and automatically applies the positive VPP voltage from the second on-chip capacitor through the VPP-level shifter to a global word line of the corresponding paired Flash cell to initiate a store operation for writing logic data of each SRAM cell into the corresponding paired Flash cell under a FN-channel scheme without erase operation.

27. The VCC power system of claim 26 wherein each NVSRAM cell is selected from a 12-transistor NVSRAM cell having one 6-transistor SRAM cell coupled to at least one paired flash transistor in one 6-transistor Flash cell and a 10-transistor NVSRAM cell having one 6-transistor SRAM cell coupled to at least one paired flash transistor in one 4-transistor Flash cell.

28. The VCC power system of claim 27 wherein each of the at least one paired flash transistor is selected from a 2-poly floating-gate NMOS transistor, a 2-poly floating-gate PMOS transistor, a 1-poly charge-trapping SONOS or MONOS transistor.

29. The VCC power system of claim 26 wherein the first on-chip capacitor and the second on-chip capacitor are formed with an flexibility of increasing respective capacitances by adding one or more Metal-insulator-metal (MIM) layers shielded from existing top metal layer used for the VCC power line and connections to the HV pump device of the NVSRAM memory chip.

30. The VCC power system of claim 26 further comprising a low-frequency oscillator configured to set a frequency to refresh the HV pump device for charging the second on-chip capacitor to the positive VPP voltage.

31. The VCC power system of claim 30 wherein the frequency is in a range of 2.0 to 10 Mhz with the regular off-chip power supply providing the VDD voltage for fast program operation within 5 ms, the frequency is reduced to a range of 0.2 to 1 Mhz or lower during normal SRAM operation without need any high-voltage, and the frequency is set to zero once the power-loss state is detected by the VCC detector.

32. The VCC power system of claim 26 wherein the power-loss state further initiates disabling the HV pump device, disconnecting the VCC power line from each SRAM cell, making each paired select transistor in conduction state between the SRAM cell and the corresponding paired Flash cell, and disconnecting the paired Flash cell to corresponding source lines.

33. The VCC power system of claim 26 wherein the charged positive VPP voltage is at least +15V applied to the global word line of each paired Flash cell in the NVSRAM memory chip for increasing/decreasing threshold levels of the corresponding paired Flash cell made by 2-poly floating-gate NMOS/PMOS transistors during a store operation under FN-channel scheme without any erase operation.

34. The VCC power system of claim 26 wherein the charged positive VPP voltage is at least +10V applied to the global word line of each paired Flash cell in the NVSRAM memory chip for increasing threshold levels of the corresponding paired Flash cell made by 1-poly charge-trapping SONOS/MONOS transistors during a store operation under FN-channel scheme without any erase operation.

35. The VCC power system of claim 26 further comprising a negative HV pump device connected to the global flash word line of each paired Flash cell with the regular off-chip power supply providing the VDD voltage for providing a negative VNN voltage to perform a regular NVSRAM erase operation, the negative HV pump device being connected to the VPP-level shifter that contains only HV PMOS devices.

* * * * *